United States Patent
Bhavnagarwala et al.

(10) Patent No.: US 7,259,986 B2
(45) Date of Patent: Aug. 21, 2007

(54) CIRCUITS AND METHODS FOR PROVIDING LOW VOLTAGE, HIGH PERFORMANCE REGISTER FILES

(75) Inventors: Azeez J. Bhavnagarwala, Newtown, CT (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 11/089,941

(22) Filed: Mar. 25, 2005

(65) Prior Publication Data
US 2006/0215465 A1    Sep. 28, 2006

(51) Int. Cl.
G11C 11/34    (2006.01)
(52) U.S. Cl. .............................. 365/185.02; 365/185.16
(58) Field of Classification Search ................. 326/88, 326/92; 365/185.07, 189.11, 185.16, 226, 365/185.23, 185.26, 185.02; 327/589, 390; 330/156
See application file for complete search history.

(56) References Cited

U.S. PATENT DOCUMENTS

| | | | |
|---|---|---|---|
| 6,049,245 A * | 4/2000 | Son et al. ................... 327/544 |
| 6,055,205 A * | 4/2000 | Rao et al. ............... 365/230.06 |
| 6,735,145 B1 * | 5/2004 | Atallah et al. ......... 365/230.06 |
| 6,788,566 B1 | 9/2004 | Bhavnagarwala et al. .. 365/154 |
| 6,839,299 B1 * | 1/2005 | Bhavnagarwala et al. .. 365/226 |
| 6,977,519 B2 * | 12/2005 | Bhavnagarwala et al. .... 326/34 |
| 6,987,686 B2 * | 1/2006 | Kim et al. ..................... 365/78 |
| 7,180,818 B2 * | 2/2007 | Joshi et al. ............ 365/230.05 |
| 2003/0214848 A1 | 11/2003 | Frydel ........................ 365/190 |
| 2006/0091913 A1 * | 5/2006 | Bhattacharya ................ 326/97 |
| 2006/0103023 A1 * | 5/2006 | Bhavnagarwala et al. .. 257/758 |
| 2006/0109733 A1 * | 5/2006 | Joshi et al. ............ 365/230.05 |

OTHER PUBLICATIONS

Yoshizawa et al. MOSFET-Only Switched-Capacitor Circuits in Digital CMOS Technologies. Jun. 9-12, 1997. 1997 IEEE International Symposium on Circuits and Systems. pp. 457-460.*
Bhavnagarwala et al. A Transregional CMOS SRAM with Signle, Logic Vdd and Dynamic Power Rails. Jun. 17-19, 2004. VLSI Circuits 2004. pp. 292-293.*

* cited by examiner

Primary Examiner—Richard T. Elms
Assistant Examiner—Alexander Sofocleous
(74) Attorney, Agent, or Firm—F. Chau & Associates, LLC; Frank V. DeRosa

(57) ABSTRACT

Circuits and methods are provided to implement low voltage, higher performance semiconductor memory devices such as CMOS static random access memory (SRAM) or multi-port register files. For example, circuits and methods are provided for dynamically adjusting power supply and/or ground line voltages that are applied to the memory cells during different modes of memory operation to enable low voltage, high performance operation of the memory devices.

22 Claims, 5 Drawing Sheets

US 7,259,986 B2

CIRCUITS AND METHODS FOR PROVIDING LOW VOLTAGE, HIGH PERFORMANCE REGISTER FILES

TECHNICAL FIELD OF THE INVENTION

The present invention relates generally to semiconductor memory devices such as CMOS static random access memory (SRAM) or multi-port register files and in particular, to circuits and methods for dynamically adjusting supply and/or ground line voltages that are applied to the memory cells during different modes of operation to enable low voltage, high performance operation of the memory devices.

BACKGROUND here is a continuing demand for semiconductor memory devices with higher density and low power consumption. Indeed, integration density and power are important factors that are considered when determining which type of memory to implement for a given application. Semiconductor memory devices include, for example, register files or CMOS static random access memory (SRAM). Other types of memory include DRAM (dynamic random access memory) devices. Although DRAM provides a high degree of integration, SRAM is typically preferred over DRAM because SRAM cells can operate at higher speeds and lower power dissipation than DRAM cells. Indeed, SRAM cells typically do not require refreshing and can store data indefinitely as long as such cells are powered. In contrast, DRAM cells must be periodically refreshed.

Register files are typically used in very high performance applications where several read and write ports enable data to be read and written into the file, simultaneously, by different functional units that access the same set of data during the same cycle. Since the register file cell uses many ports for reads and writes, it is typically much larger than a single port SRAM cell limiting the number of bits stored in the register file. Moreover, with low voltage applications, SRAM memories are susceptible to noise, thus decreasing the stability of the memory cells.

SUMMARY OF THE INVENTION

Exemplary embodiments of the invention generally include circuits and methods for providing low voltage, higher performance semiconductor memory devices such as CMOS static random access memory (SRAM) or multi-port register files. More specifically, exemplary embodiments of the invention include circuits and methods for dynamically adjusting power and/or ground line voltages that are applied to the memory cells during different modes of memory operation to enable low voltage, high performance operation of the memory devices.

For example, in one exemplary embodiment of the invention, a register file memory device includes a power supply line, a storage element connected to the power supply line, and a bootstrap circuit that is operatively connected to the power supply line. The bootstrap circuit is responsive to a read access signal to decouple the power supply line from a power supply node and bootstrap the power supply line by the read access signal to increase a power supply line voltage during a read access of the storage element.

In one exemplary embodiment of the invention, the bootstrap circuit includes a switch device connected between the power supply node and the power supply line. The switch device may be a transistor having a gate connected to a read wordline. The switch device selectively couples and decouples the power supply line and power supply node in response to the read access signal on the read wordline. The bootstrap circuit further includes a coupling device that capacitively couples the power supply line to the read wordline. The coupling device may be a capacitor connected to the read word line and the power supply line. The capacitor may be implemented as an inverted MOSFET device.

In yet another exemplary embodiment of the invention, the bootstrap circuit is implemented using a switch device, a logic device and a coupling device. The switch device is connected between the power supply node and the power supply line to couple and decouple the power supply line and power supply node in response to the read access signal on a read wordline. The logic gate has an input connected to the read wordline and the logic gate outputs the read access signal on the read wordline to the coupling device, which capacitively couples the output of the logic gate to the power supply line. In one exemplary embodiment, the logic gate is an OR gate having a plurality of read wordlines as inputs.

In another exemplary embodiment of the invention, the register file memory device further includes a virtual ground line and ground line, and a voltage regulating circuit, operatively connected to the virtual ground line and the ground line. The storage element is connected between the power supply line and the virtual ground line. The voltage regulating circuit regulates a virtual ground voltage on the virtual ground line such that the virtual ground voltage varies between a first ground voltage that is equal to a ground voltage level applied on the ground line and a second ground voltage that is greater than the ground voltage level.

In one exemplary embodiment of the invention, the voltage regulating circuit includes a diode to pin the virtual ground line to the second voltage, and a footer transistor shunted in parallel with the diode to discharge the virtual ground line to the first voltage in response to a control signal applied to a gate of the footer transistor.

The voltage regulating circuit can operate to maintain the virtual ground line at the second ground voltage during a write access operation of the storage element, and during a standby mode. The voltage regulating circuit can operate to maintain the virtual ground line at the first ground voltage during a read access operation of the storage element.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
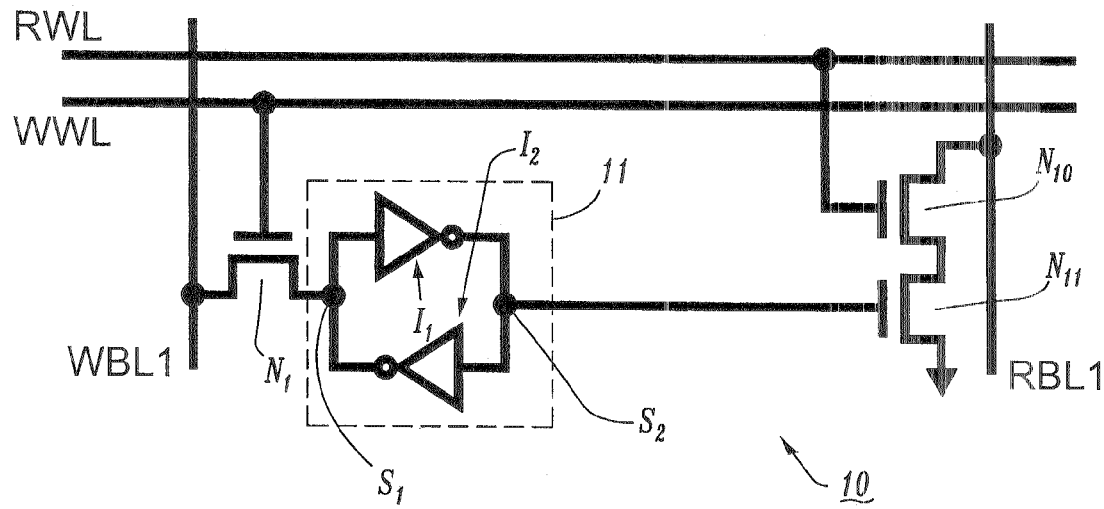
FIG. 1 is schematically illustrates a register file cell having a single port write, single port read and single ended write architecture.
Figure 2:
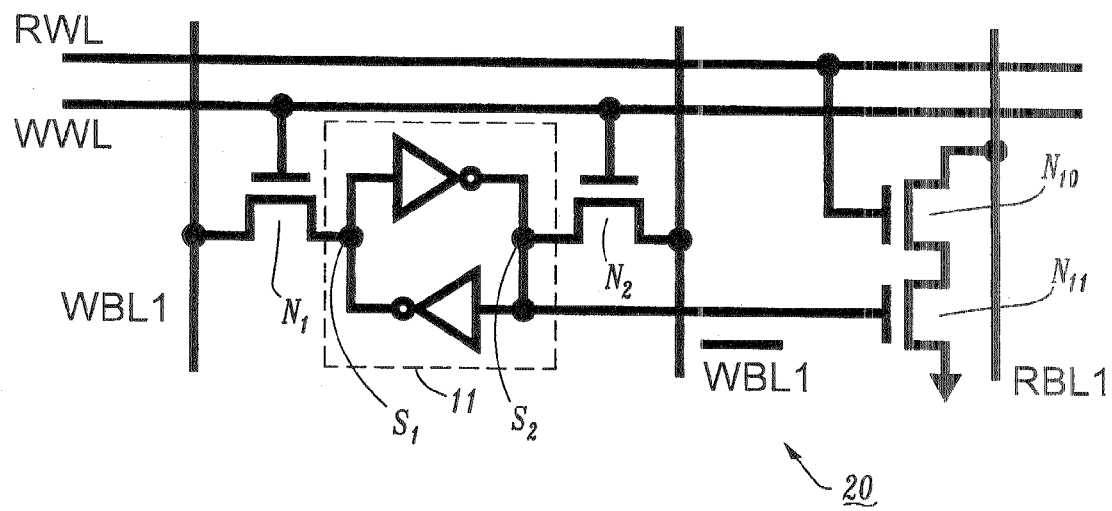
FIG. 2 schematically illustrates a register file cell having a single port write, single port read and dual ended write architecture.
Figure 3:
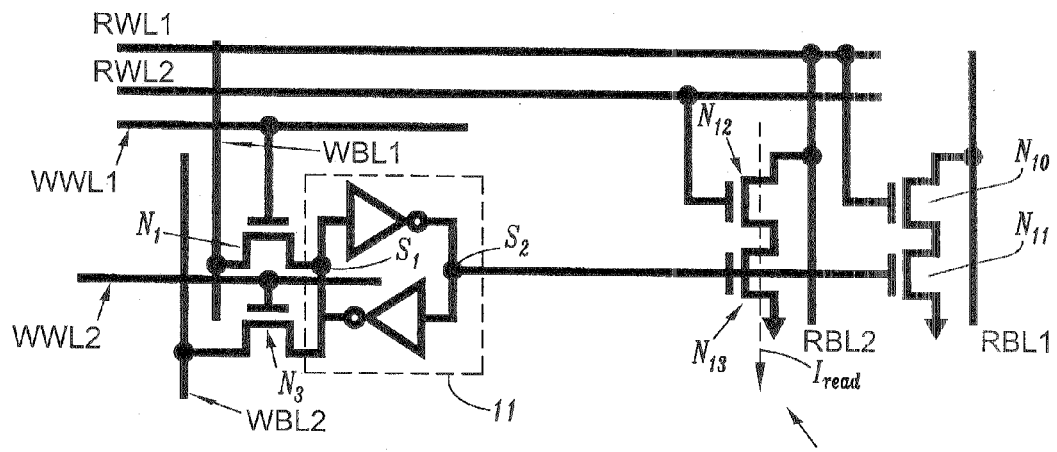
FIG. 3 schematically illustrates a register file cell having a multi-port read, multi-port write and single-ended write architecture.

FIGS. 1-3 are schematic circuit diagrams of register file cells of register files, which can be implemented with circuits and methods of the invention to enable low voltage, high performance operation of such register files. In particular, FIG. 1 is a register file cell (10) having a single port write, single port read and single-ended write architecture. The register cell (10) comprises a storage element (11) that stores a single bit of data, a write circuit comprising an NMOS transistor N1 (or NFET), and a read circuit comprising NMOS transistors N10 and N11 (or NFETs). The storage element (11) comprises a bistable functional device formed of an inverter loop comprising inverters I1 and I2, the function of which is known in the art. Multiple registers comprised of register cell (10) may be coupled together in an array of rows and columns to form a register file, as is known in the art.

The write transistor N1 has a gate connected to a write wordline WWL, a source connected to a write bitline WBL1 and a drain connected to node S1 of storage element (11). In the read circuit, the drain of N10 is coupled to a read bitline RBL1, the gate of N10 is coupled to a read wordline RWL, and the source of N10 is coupled to the drain of N11. The source of N11 is coupled to ground (actual ground (Vss) or a virtual ground (VGND) as explained below). The gate of N11 is coupled to the output node S2 of storage element (11).

Collectively, WWL and WBL1 comprise a single write port. When a data bit is to be written to the cell (10), WWL is activated to activate the write transistor N1 and the data to be written into the cell is driven onto WBL1 to write a bit value into the storage element (11) through the write transistor N1. Collectively, the read wordline RWL read bitline RBL1 comprise a single read port. When data is to be read from the cell, control signals are applied to the read wordline RWL (which activates N10) and to the read bitline RBL1, to thereby read the value stored at node S2 in element (11). Methods for writing and reading register files having a cell architecture as in FIG. 1 are known in the art and thus, a detailed explanation is not necessary.

FIG. 2 schematically illustrates a register file cell (20) having a single port write, single port read and dual-ended write architecture. The register cell (20) of FIG. 2 is similar to the register cell (10) of FIG. 1, but a write circuit comprises first and second write transistors N1 and N2 and a complementary pair of write bitlines WBL1 and /WBL1. As with the register file cell of FIG. 1, separate read and write wordlines enables the cell to be accessed separately for reads or writes. Since a register file cell is typically used when multiple ports are required, it is more practical to implement a single ended write scheme as shown in FIG. 1 where only a single write bitline WBL1 is necessary.

FIG. 3 is a schematic circuit diagram of a multi-ported register file cell (30) which extends the single-ended write framework of FIG. 1 to multiple ports for writes and reads. More specifically, FIG. 3 depicts a register file cell (30) with two write ports and two read ports, but the register cell (30) may include any number of read ports and write ports and still enjoy the advantages of the present invention. The register file is considered "multi-ported" because more than one functional block may write and/or read registers in the register file simultaneously.

The register cell (30) is similar to the register cell (10) of FIG. 1, but the register cell (30) comprises a plurality of write transistors N1 and N3 and a plurality of read circuits comprising a plurality of NFET stacks N10-N11 and N12-N13. The write transistor N1 has a gate connected to a first write wordline WWL1, a source connected to a first write bitline WBL1 and a drain connected to node S1 of storage element (11). The write transistor N3 has a gate connected to a second write wordline WWL2, a source connected to a second write bitline WBL2 and a drain connected to node S1 of storage element (11).

In a first read circuit, the drain of N10 is coupled to a first read bitline RBL1, the gate of N10 is coupled to a first read wordline RWL1, and the source of N10 is coupled to the drain of N11. The source of N11 is coupled to ground (actual ground (Vss) or a virtual ground VGND as explained below). The gate of N11 is coupled to the output node S2 of storage element (11). In the second read circuit, the drain of N12 is coupled to a second read bitline RBL2, the gate of N12 is coupled to a second read wordline RWL2, and the source of N12 is coupled to the drain of N13. The source of N13 is coupled to ground (actual ground (Vss) or a virtual ground VGND as explained below). The gate of N13 is coupled to the output node S2 of storage element (11). Collectively, WWL1 and WBL1 comprise a first write port and WWL2 and WBL2 comprise a second write port. Collectively, the read wordline RWL1 and the read bitline RBL1 comprise a first read port and the read wordline RWL2 and the read bitline RBL2 comprise a second read port.

In the exemplary embodiments of FIG. 3, as the number of read ports (typically 4-8) increases, the more limited in area the cell becomes due to the increased area consumed by the read circuit NFET stacks. Further, as shown in FIG. 3, the performance of the register file cell (30) is determined by the read current, $I_{read}$, sinking through a selected NFET stack (e.g., N12-N13). Since register files typically do not employ sense amplifiers (the cell devices are large enough to develop full signal on the Read Bit Line), the NFET stack saturation current limits the cell performance.

For high performance applications at low voltages, the NFET stack devices in the read circuits can be made wider to improve performance, but this directly impacts cell and array size if a large number of read ports are used. Alternatively, the read circuit NFET stacks can be implemented with low $V_T$ (voltage threshold) devices to improve the cell performance without increasing cell size, but the use of low $V_T$ devices significantly increases cell leakage.

Therefore, in accordance with one exemplary embodiment of the invention, circuits and methods are provided for use with register file cells (such as depicted in FIGS. 1-3) to temporarily increase the power supply voltage of the register file during a read access to improve read stability. Furthermore, in accordance with another exemplary embodiment of the invention, circuits and methods are provided for use with register file cells (such as depicted in FIGS. 1-3) to increase a virtual ground VGND voltage applied to the cell (increase to a value above ground GND voltage) during a write access to improve write margins.

Figure 4:
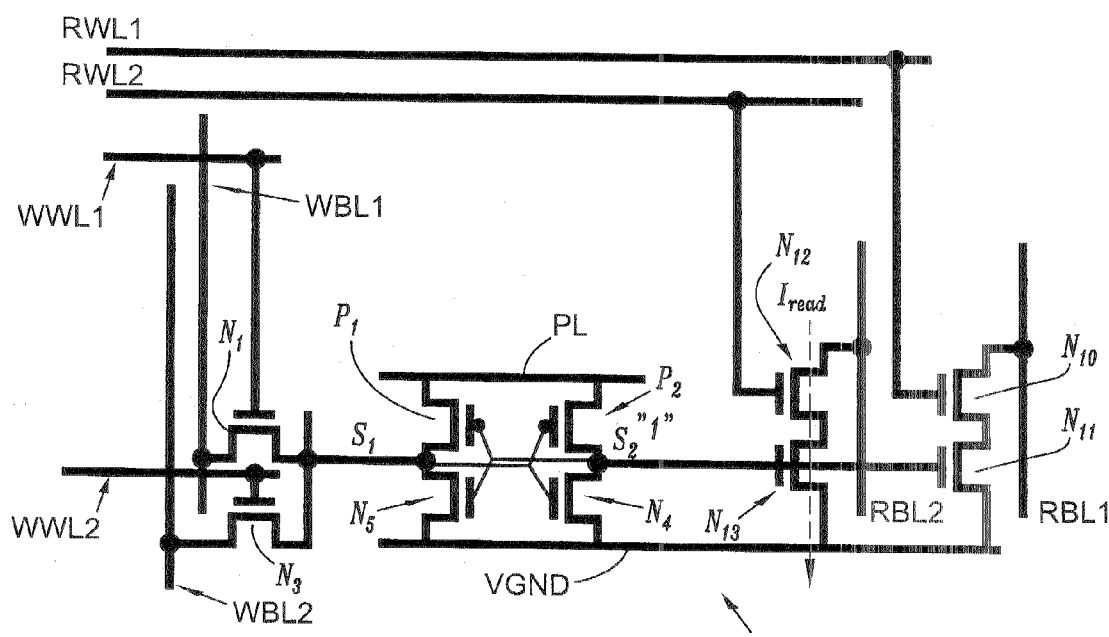
FIG. 4 schematically illustrates a register file according to an exemplary embodiment of the invention.

For purposes of illustration, exemplary embodiments of the invention will be described with reference to the register file cell (40) of FIG. 4. FIG. 4 is similar to FIG. 3, except that the cell (40) of FIG. 4 depicts an exemplary embodiment of the storage element (11) comprising two cross-coupled inverters that form a latch circuit. The latch is connected between a power supply line PL (which is coupled to VDD power supply node) and a virtual ground line VGND. Each inverter comprises two transistors—a first inverter comprising an NMOS pull-down transistor N5 and pull-up PMOS transistor P1, and a second inverter comprising an NMOS pull-down transistor N4 and pull-up PMOS transistor P2. The latch, which is formed by the first and second cross-coupled inverters, is connected between two storage nodes S1 and S2, wherein one of the storage nodes is pulled low and the other storage node is pulled high. The first storage node S1 is connected to the write transistors N1 and N3 and the second storage node S2 is connected to the gate terminals of N13 and N11 in read circuits.

In the exemplary embodiment of FIG. 4, when the bit value of the storage element (11) is logic "1" (at node S2), the performance of the read operation can be diminished when low VDD voltage levels (1V or less) are applied to the power supply line PL. Indeed, since the voltage of node S2 is applied to the gates of the transistors N13 and N11 during a read operation, when the bit value at node S2 is logic "1" (e.g., about the VDD voltage level), a low Vgs voltage of such transistors N13 and N11 during the read access limits the cell performance (slower speed, and lower $I_{read}$)

Figure 5:
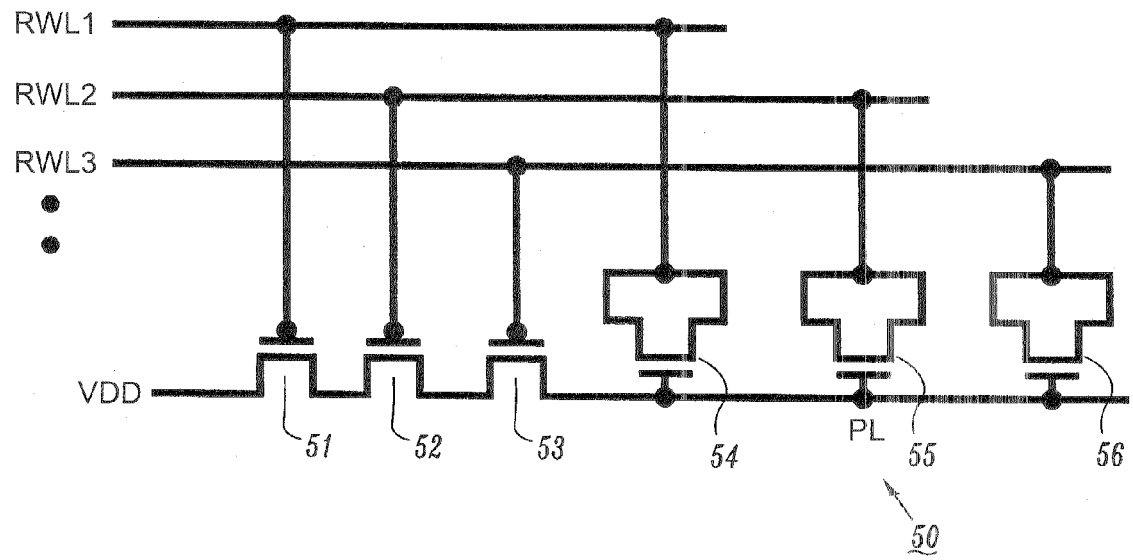
FIG. 5 schematically illustrates a bootstrapping circuit according to an exemplary embodiment of the invention.

FIG. 5 schematically illustrates a bootstrapping circuit according to an exemplary embodiment of the invention. In general, FIG. 5 depicts a bootstrapping circuit (50) which can be implemented in the register cell framework of FIG. 4 to temporarily increase the voltage level on the power supply line PL to a voltage greater than VDD during a read operation to thereby increase the cell bit value (at node S2) applied to the gate of transistors N13 and N11. More specifically, the exemplary embodiment of FIG. 5 depicts a bootstrapping circuit (50) for bootstrapping the power supply line PL (which is connected to each cell in a row of register file cells) by a RWL select transition during a read operation through capacitive coupling the read wordline RWL and power supply line PL.

The exemplary bootstrapping circuit (50) comprises a plurality of PMOS transistors (51), (52) and (53) which are serially connected between a power supply node VDD and the power supply line PL that supplies VDD power to the storage elements in a row of register cells. The gate of the PMOS transistors (51), (52) and (53) are connected to respective read wordlines, RWL1, RWL2, and RWL3. The circuit (50) further comprises a plurality of inverted MOS-FET NMOS devices (54), (55) and (56) that capacitively couple the power supply line PL to respective read word lines RWL1, RWL2, and RWL3. The bootstrapping circuit (50) provides capacitive coupling between a selected one of the read wordlines RWLi and the power supply line PL to thereby boost the PL voltage to some level above VDD during the read access operation. During inactive periods, the circuit (50) operates to strap the power supply line PL to VDD through the PFET stack (51), (52), (53), and to decouple the power supply line PL from the VDD power supply during the read access (due to deactivation of one of the PFETs (51), 52, (53)) to place the power supply line PL into a floating state that enables the PL voltage to be boosted, as explained in detail below with reference to FIG. 6.

Figure 6:
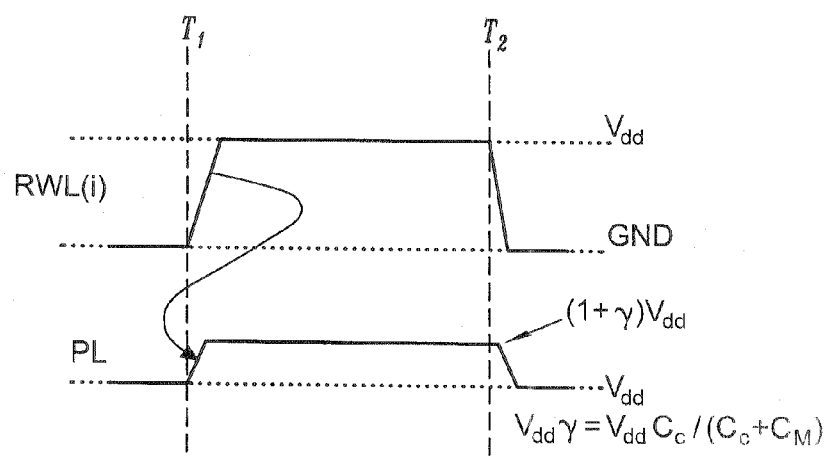
FIG. 6 is a timing diagram illustrating a bootstrapping method according to an exemplary embodiment of the invention.

FIG. 6 is a timing diagram illustrating a method for bootstrapping according to an exemplary embodiment of the invention, which illustrates operation of the circuit (50) of FIG. 5. During an inactive period (prior to T1), the voltage on each read wordline RWLi is at logic "low". During such inactive period, the PMOS devices (51), (52) and (53) are turned "ON" thereby coupling the VDD voltage to the power supply line PL (i.e., PL is at VDD). At time T1, a read operation is commenced and one of the read wordlines RWL(i) transitions from logic "0" (GND) to logic "1" (VDD). In response, a corresponding PMOS device (51), (52) or (53) turns "off", causing the power supply line PL to be decoupled from the VDD supply node and become a floating node having an initial voltage VDD.

As further shown in FIG. 6, after T1, the activated read wordline RWL(i) is capacitively coupled to the power supply line PL via one of the corresponding devices (54), (55) or 56), which causes the voltage on the floating power supply line PL to increase from the initial VDD level as the voltage on the activated read wordline RLW(i) increases by virtue of said capacitive coupling. More specifically, the voltage boost on power supply line PL will increase from VDD to a value of about $(1+\gamma)$VDD, where VDD$\gamma$=VDD $(C_c/C_c+C_M)$. The term $C_c$ denotes the coupling capacitance between the selected read wordline RWL(i) and the power supply line PL and $C_M$ denotes the total capacitance (e.g., parasitic capacitances and coupling capacitors) of the power supply line PL.

In the exemplary circuits and methods of FIGS. 5 and 6, the voltage boost on the power supply line PL is achieved by coupling the selected read wordline RWL of the register file cell with the power supply line PL. The voltage boost on the power supply line PL results in increased cell performance in circumstances when the cell value at node S2 is at logic "1". Indeed, when node S2 is at logic "1", the increase in the voltage of the supply line results in the increase of the logic "1" voltage level, which results in a larger gate voltage being applied to the read circuit transistors (e.g., N13 and N11 in FIG. 4) for the read operation. The increase gate voltage of the read circuit transistors effectively increase in the $I_{read}$ current which enhances cell performance. This is particularly applicable for low voltage operation (e.g., VDD<1V), where lower voltages of logic "1" applied to the gate terminals of the read circuit transistors would result in decreased speed. By increasing the voltage of the power supply line PL during a read access, improved performance is obtained for the read operation, which eliminates the need to decrease the threshold voltage $V_T$ of the read circuit transistors (which results in more leakage) or otherwise increase the size of the read circuit transistors for greater Iread (which results in increased area overhead).

Figure 8:
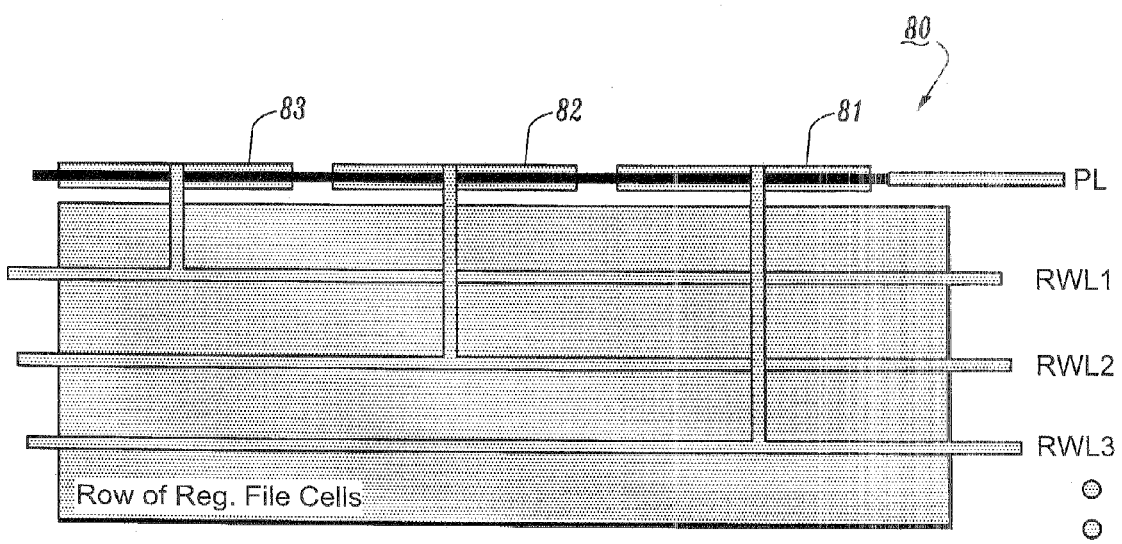
FIG. 8 is an exemplary schematic layout view of a register file having a bootstrapping circuit as depicted in FIG. 5.

In fact, the exemplary circuit (50) of FIG. 5 results in a minimum increase in the layout area that is needed for implementing the circuit (50). For instance, FIG. 8 is an exemplary depiction of a layout of a register file that implements the bootstrapping circuit (50) of FIG. 5. In FIG. 8, only one single finger of polysilicon is needed to implement the inverted MOSFET capacitors (81), (82), and (83), which accounts for most of the increased overhead.

Figure 7:
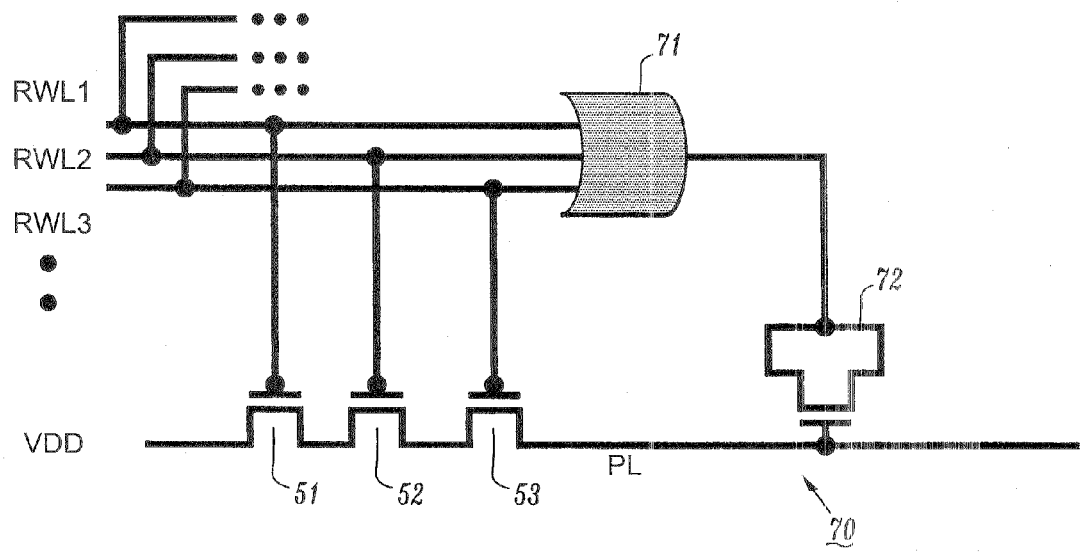
FIG. 7 schematically illustrates a bootstrapping circuit according to another exemplary embodiment of the invention.

FIG. 7 schematically illustrates a bootstrapping circuit according to another exemplary embodiment of the invention, for bootstrapping the power supply line PL of a row of register file cells by a RWL select transition during a read operation through capacitive coupling of the selected read wordline RWL and power supply line PL. In particular, FIG.

7 illustrates a bootstrapping circuit (70) which is similar in operation to the circuit (50) of FIG. 5, except that in FIG. 7 all read wordlines RWL(i) are logically "OR"ed requiring only a single transistor to be used to couple the power supply line PL to the selected read word line RWL(i).

More specifically, similar to FIG. 5, the exemplary bootstrapping circuit (70) comprises PMOS transistors (51), (52) and (53), which are serially connected between a power supply VDD node and the power supply line PL (which supplies VDD power to storage cells in a row of register cells). The circuit (70) comprises an OR gate (71) having an input terminal for each read wordline RWL(i). The output of the OR gate (71) is coupled to the power supply line PL through a single inverted MOSFET capacitor (72). Thus, in the exemplary embodiment of FIG. 7, the exemplary multi-read port register file of FIG. 4 would have each read wordline RWL(i) logically "OR"ed to drive a single inverted MOSFET coupling a select transition from any of the RWL(i)s to the power supply line PL to boost the cell supply voltage during a read access.

In other exemplary embodiments of the invention, as noted above, circuits and methods are provided to increase register cell performance by dynamically changing the virtual ground VGND voltage levels applied to the register cells and read transistors during periods of standby and write access operations. More specifically, in one exemplary embodiment of the invention, the voltage level of the VGND line is raised to a voltage that is greater than the true ground voltage GND during standby (inactive periods), to effectively reduce current leakage and thus reduce power consumption. In another embodiment, the voltage level of the VGND line is decreased to the true ground voltage GND level during a read operation to increase the cell performance for the read operation. In yet another embodiment of the invention, the voltage level of the VGND line is increased to a level that is greater than the true ground GND voltage during a write operation to increase the cell stability during the write operation.

Figure 9:
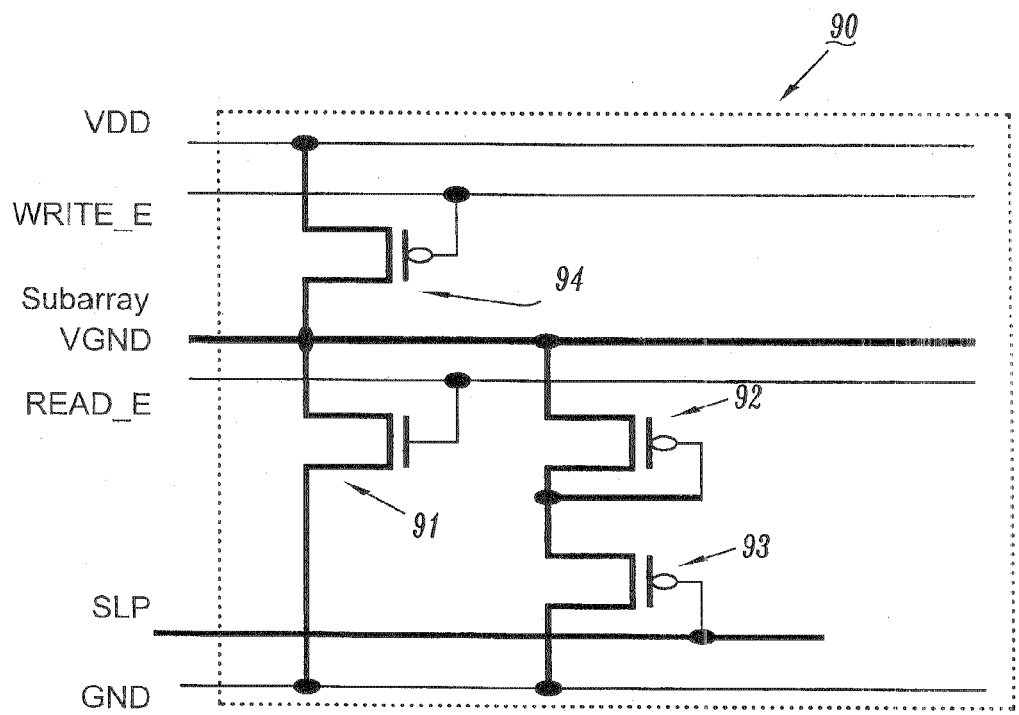
FIG. 9 schematically illustrates a circuit for controlling a virtual ground line voltage according to an exemplary embodiment of the invention.

FIG. 9 is a schematic circuit diagram illustrating a circuit (90) for controlling a virtual ground VGND voltage according to an exemplary embodiment of the invention. The exemplary circuit (90) comprises an NFET transistor (91), PFET transistors (92) and (93) and NFET transistor (94). The NFET transistor (91) has a drain connected to a subarray virtual ground (VGND) line, a gate connected to a read enable (READ_E) select control line and a source connected to a ground (GND) line. The PFET transistor (92) has a gate connected to its drain and acts as a diode. The PFET (93) has a gate connected to a sleep (SLP) control line and drain connected to the GND line. The PFET (94) has a gate connected to a write enable (WRITE_E) control line, a drain connected to the VGND line and a source connected to the power supply VDD line.

In general, the circuit (90) operates to pin the VGND of the registers cells to a voltage above GND during inactive periods. The exemplary circuit (90) of FIG. 9 can be implemented in the exemplary embodiment of FIG. 4 to control the virtual ground line VGND of the register file cell (40). The circuit (90) operates to maintain the virtual ground voltage line VGND at a voltage which is higher than the true ground GND voltage during inactive periods, which, as explained below, effectively lowers the voltage across the cell resulting in a significant reduction is leakage. Further, for a read operation, the circuit (90) operates to discharge the VGND line voltage to the true ground GND voltage level in advance of a RWL select, which as explained below, enhances the read performance of the cell. In addition, for write operations, the circuit (90) operates to raise the VGND line voltage to a voltage that is greater than the true ground GND voltage level to thereby improve write margins.

Figure 10:
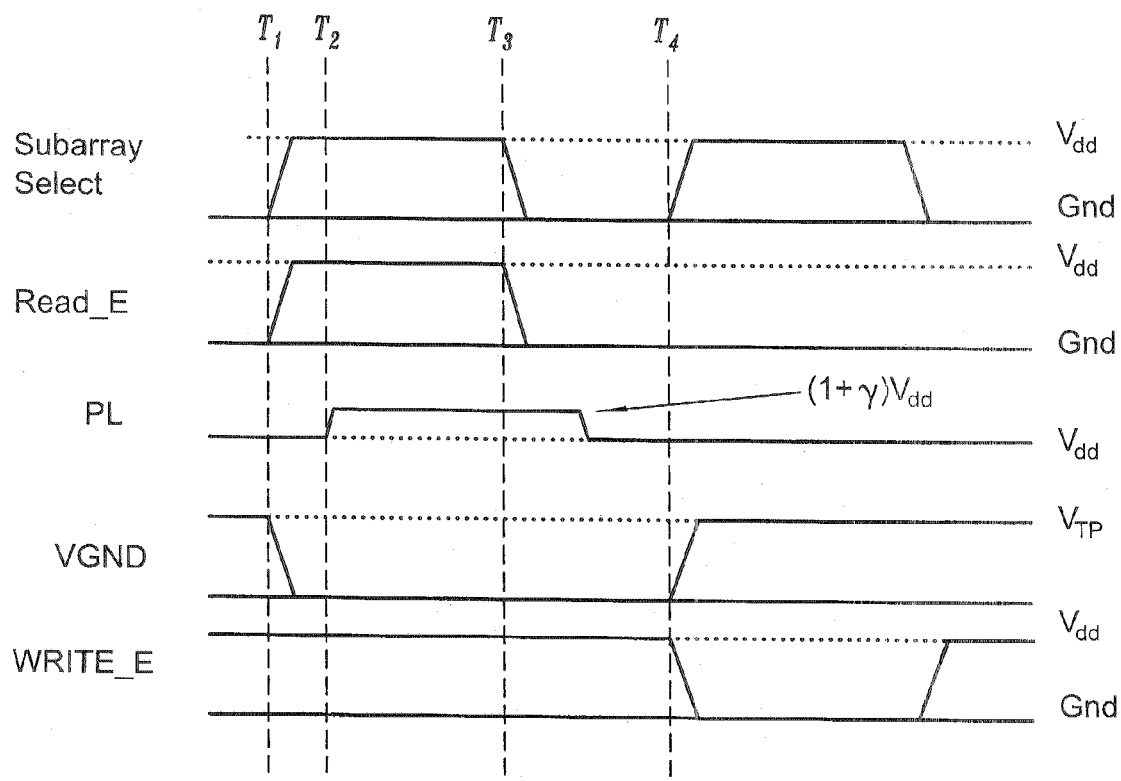
FIG. 10 is an exemplary timing diagram illustrating methods for controlling a virtual ground line voltage using the exemplary circuit of FIG. 9, according to an exemplary embodiment of the invention.

FIG. 10 is a timing diagram illustrating operational modes of the circuit of FIG. 9. In particular, the timing diagram of FIG. 10 depicts the logic states of exemplary control signals Subarray_Select, READ_E and WRITE_E during inactive (standby) periods and during cell access operations (read and write), as well as the voltage level transitions of the power supply line PL and virtual ground VGND line during such periods. The READ_E and WRITE_E are local control signals that are input to a selected subarray of register cells, which is accessed (for read or write) during a given clock cycle. The Subarray_Select signal is driven by address decoders that select a subarray of register cells for access, and such signal is decoded with row decoders to select a given RWL. The Subarray_Select signal is logically ANDed with a global Read_Enable (not shown) to generate the local READ_E signal that is active only in the subarray having a row of cells selected for Read. Moreover, the Subarray_Select signal is logically ANDed with a global Write_Enable (not shown), and the output of the AND is inverted to generate the local WRITE_E signal which is applied to the selected subarray of register cells.

Referring now to the exemplary timing diagram of FIG. 10, prior to time T1, the register is assumed to be in a standby mode, wherein the power supply line PL voltage is at VDD and the VGND line voltage is $V_{TP}$ (which is greater than the true GND voltage). The voltage $V_{TP}$ is equal to some value $nV_T$, where $V_T$ is the threshold voltage of the PFETs (92) and (93) in FIG. 9, and where n is a value greater than 1 and less than 2. Further, the controls signals SLP, Subarray_Select and READ_E are at logic "0" (GND voltage), and control signal WRITE_E is at logic "1". Consequently, the PFET (94) is in an "Off" state due to the WRITE_E (at logic "1") applied to its gate terminal, and the NFET (91) is in an "Off" state due to the READ_E signal (at logic "0") applied to its gate terminal. The PFET stack devices (92) and (93) are "on", and operate to pin the VGND line voltage at $V_{TP}$.

Then, at time T1, the Subarray_Select and READ_E signals are activated to logic "1", which causes the footer device (91) (FIG. 9) to turn "on" and discharge the VGND line voltage from $V_{TP}$ to the GND voltage. Then, at time T2, as discussed in FIG. 6 above, a read wordline RWL is activated to logic "1" causing a voltage boost on the power supply line PL to a value of $(1+\gamma)VDD$ during the read operation. Accordingly, the synchronized increase in power supply line PL voltage and decrease in VGND line voltage achieves increased cell performance for the read operation.

At time T3, after the read operation, the control signals Subarray_Select and READ_E are deactivated (to logic "0"), thus causing footer device (91) to turn off. At this point, the voltage of the VGND line is at GND voltage. However, during a standby period subsequent to the read operation, leakage from inactive cells cause the VGND line voltage to gradually increase from GND to $V_{TP}$, and the VGND voltage is maintained at such increased level $V_{TP}$ by the PFET diode stack (i.e., transistors 92 and 93 in FIG. 9).

The circuit (90) provides a mechanism to increase the VGND line voltage to $V_{TP}$ for a write access operation, irrespective of whether the VGND line voltage has reached the increased $V_{TP}$ level by virtue of cell leakage. More specifically, as depicted in FIG. 10, at time T4, the control signals Subarray_Select and WRITE_E are activated to logic "1" and logic "0", respectively, which causes the PFET (94) in FIG. 9 to turn "on" in response to the WRITE_E of logic "0" applied to its gate. The activation of PFET (94) causes the VGND line voltage to quickly increase to the increased $V_{TP}$ voltage above the GND voltage. The increased voltage on the VGND line allows the cells in the subarray to be more easily written to as explained below. Moreover, as depicted in FIG. 10, after the write access operation, the VGND line voltage is maintained at the increase voltage level $V_{TP}$ during the standby period subsequent to the write access.

Furthermore, in the exemplary embodiment of FIG. 9, during standby periods, when it is no longer desirable to maintain the stored data for a given subarray of register cells, the control signal SLP can be activated (to logic "1") to turn "off" PFET transistor (93) (in FIG. 9), thereby allowing the VGND line voltage to be significantly increased to provide further reduction in leakage from the cell subarray.

The exemplary circuits and methods of FIGS. 9 and 10 can be implemented, for example, in the exemplary embodiment of FIG. 4 along with an exemplary bootstrapping circuit (e.g., FIGS. 5 or 7) to control the VGND and power supply PL lines to provide increased cell performance. For example, during cell standby periods, the voltage on the VGND line for the register file cell (40) is increased (as described above) to decrease the voltage (PL-VGND) across the storage element (11), thereby enabling cell leakage to be reduced.

More specifically, in the exemplary embodiment of FIG. 4, when the voltage (PL-VGND) across the storage element (11) is decreased (by increasing VGND), the Vgs of the NFETs N4, N5 in the cell are smaller, thus causing the NFET N4 or N5 (which has the logic "0" applied at its gate) to be less leaky. Moreover, since the logic "0" level at node S1 or S2 is at logic level of VGND (higher than true logic "0"), the deactivated PFET P1 or P2 whose drain terminal is connected to the logic "0" node of the cell has a smaller Vgs, resulting in the deactivated PFET being less leaky during standby. This prevents the logic "0" node (S1 or S2) from increasing in voltage and flipping the logic states of the cell.

Moreover, in the exemplary embodiment of FIG. 4, since the read circuit transistors N11 and N13 are connected to VGND, the Vgs of such transistors is decreased when node S2 is at logic "1", thus reducing leakage current through such transistors N13 and N11 during standby periods.

Furthermore, for read operations, the VGND line voltage is discharged to GND voltage in advance of a read operation and the voltage of the power supply line PL is boosted above VDD, thereby resulting in a significant increase in the voltage (PL(boosted)-GND) across the cell for improved read performance, as explained above.

In addition, during cell write operations, the voltage on the VGND line for the register file cell (40) is increased (as described above) to decrease the voltage (PL-VGND) across the storage element (11) which, as noted above, increases the stability of the write operation. It is known that the noise margin for a write operation will be smaller when the voltage thresholds of the cell access transistor N1 or N3 are increased. More specifically, by way of example, assume that node S1 of the cell (11) in FIG. 4 stores a logic "0" and a write operation is commenced to drive the node S1 to logic "1". Indeed, during the write operation, the pull-down NFET N5, which holds cell node S1 at logic "0", is held low by, will fight the pull-up device P1 which is trying to write a logic "1" to the node S1. If the threshold voltage of the cell access transistor N1 or N3 is large enough, there will be enough of a voltage drop across such access transistor N1 or N3 to inhibit the pull-up transistor P1 from raising the voltage of node S1 from logic "0" to logic "1", making it difficult to write data into the cell.

However, by increasing the cell VGND line to a voltage that is greater than the true ground GND voltage during the write operation, the voltage (Pl-VGND) across the storage cell (11) is reduced, rending the pull-down NFET N5 much weaker as a result of a smaller gate-source voltage. Accordingly, the pull-up device P1 can more easily increase the voltage level at node S1 to logic "1" and flip the cell. Thus, the increase in VGND line voltage for write operations protects against large variations in the threshold voltages of the cell write transistors N1 and N3.

Although exemplary embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

We claim:

1. A register file memory device, comprising:
   a power supply line;
   a storage element connected to the power supply line; and
   a bootstrap circuit that is responsive to a read access signal to decouple the power supply line from a power supply node and bootstrap the power supply line by the read access signal to increase a power supply line voltage during a read access of the storage element, wherein the bootstrap circuit comprises:
   a switch device connected between the power supply node and the power supply line and responsive to the read access signal on a read wordline to couple and decouple the power supply line and power supply node; and
   a coupling device that capacitively couples the power supply line to the read wordline, wherein the coupling device is an inverted MOSFET device.

2. The device of claim 1, wherein the switch device is a transistor having a gate connected to the read wordline.

3. The device of claim 1, wherein the bootstrap circuit comprises:
   a logic gate having an input connected to the read wordline and an output that outputs the read access signal on the read wordline, wherein the coupling device capacitively couples the output of the logic gate to the power supply line.

4. The device of claim 3, wherein the logic gate is an OR gate.

5. A register file memory device, comprising:
   a power supply line;
   a virtual ground line; a ground line;
   a storage element connected between the power supply line and the virtual ground line;
   a bootstrap circuit that is responsive to a read access signal to decouple the power supply line from a power supply node and bootstrap the power supply line by the read access signal to increase a power supply line voltage during a read access of the storage element; and
   a voltage regulating circuit, operatively connected to the virtual ground line and the ground line, to regulate a virtual ground voltage on the virtual ground line such that the virtual ground voltage varies between a first ground voltage that is equal to a ground voltage level applied on the ground line and a second ground voltage that is greater than the ground voltage level.

6. The device of claim 5, wherein the voltage regulating circuit comprises:
   a diode to pin the virtual ground line to the second voltage; and
   a footer transistor shunted in parallel with the diode to discharge the virtual ground line to the first voltage in response to a control signal applied to a gate of the footer transistor.

7. The device of claim 5, wherein the voltage regulating circuit maintains the virtual ground line at the second ground voltage during a write access operation of the storage element, and during a standby mode.

8. The device of claim 5, wherein the voltage regulating circuit maintains the virtual ground line at the first ground voltage during the read access operation of the storage element.

9. The device of claim 5, wherein the device comprises a multi-port register file memory device.

10. The device of claim 5, wherein the bootstrap circuit comprises:
    a switch device connected between the power supply node and the power supply line and responsive to the read access signal on a read wordline to couple and decouple the power supply line and power supply node; and
    a coupling device that capacitively couples the power supply line to the read wordline.

11. The device of claim 10, wherein the switch device is a transistor having a gate connected to the read wordline.

12. The device of claim 10, wherein the coupling device comprises a capacitor connected to the read wordline and the power supply line.

13. The device of claim 12, wherein the capacitor is an inverted MOSFET device.

14. The device of claim 5, wherein the bootstrap circuit comprises:
    a switch device connected between the power supply node and the power supply line and responsive to the read access signal on a read wordline to couple and decouple the power supply line and power supply node;
    a logic gate having an input connected to the read wordline and an output that outputs the read access signal on the read wordline; and
    a coupling device that capacitively couples the output of the logic gate to the power supply line.

15. The device of claim 14, wherein the logic gate is an OR gate.

16. The device of claim 10, wherein the device comprises a multi-port register file memory device.

17. A method for performing a memory access operation, comprising the steps of:
    applying a wordline select signal to a wordline for accessing a memory cell;
    bootstrapping a power supply voltage applied to the memory cell using the wordline select signal to boost the power supply voltage applied to the memory cell for a data access operation; and
    regulating a virtual ground voltage on a virtual ground line connected to the memory cell such that the virtual ground voltage varies between a first ground voltage that is equal to a true ground voltage level and a second ground voltage that is greater than the true ground voltage level.

18. The method of claim 17, wherein applying a wordline select signal comprises applying a read wordline select signal to a read wordline.

19. The method of claim 17, wherein bootstrapping comprises:
    decoupling a power supply line from a power supply node; and
    capacitively coupling the power supply line and the selected wordline.

20. The method of claim 17, wherein the bootstrapping process is performed for a memory read operation, and wherein regulating the virtual ground voltage comprises discharging the virtual ground line from the second ground voltage to the first ground voltage in advance of the memory read operation.

21. The method of claim 17, wherein regulating the virtual ground voltage comprises charging the virtual ground line from the first ground voltage to the second ground voltage in response to control signals for a memory write operations.

22. The method of claim 17, wherein regulating the virtual ground voltage comprises maintaining the virtual ground line at the second ground voltage during a memory standby mode.

* * * * *